United States Patent
Lu et al.

(10) Patent No.: US 7,633,125 B2
(45) Date of Patent: Dec. 15, 2009

(54) INTEGRATION OF SILICON BORON NITRIDE IN HIGH VOLTAGE AND SMALL PITCH SEMICONDUCTORS

(75) Inventors: Donghui Lu, Tempe, AZ (US); Jun-Yen J. Tewg, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 236 days.

(21) Appl. No.: 11/848,422

(22) Filed: Aug. 31, 2007

(65) Prior Publication Data

US 2009/0057766 A1    Mar. 5, 2009

(51) Int. Cl.
*H01L 23/62* (2006.01)
(52) U.S. Cl. ............ 257/356; 257/649; 257/E21.266; 257/E23.167; 438/783
(58) Field of Classification Search ............... 257/356, 257/649, E21.266, E23.167; 438/783
See application file for complete search history.

(56) References Cited

U.S. PATENT DOCUMENTS

| | | | | |
|---|---|---|---|---|
| 6,066,555 | A | * 5/2000 | Nulty et al. | 438/634 |
| 2008/0081406 | A1 | * 4/2008 | Choo et al. | 438/199 |
| 2008/0293207 | A1 | * 11/2008 | Koutny et al. | 438/306 |

* cited by examiner

*Primary Examiner*—Trung Dang
(74) *Attorney, Agent, or Firm*—Cool Patent, P.C.; Joseph P. Curtin

(57) ABSTRACT

Integration of silicon boron nitride in high voltage semiconductors is generally described. In one example, a microelectronic apparatus includes a semiconductor substrate upon which transistors of an integrated circuit are formed, a plurality of transistor gates formed upon the semiconductor substrate, a gate spacer dielectric disposed between the gates, and a contact etch stop dielectric disposed upon the gates and gate spacer dielectric, the contact etch stop dielectric comprising silicon boron nitride (SiBN) to reduce breakdown of the contact etch stop dielectric in high voltage applications.

20 Claims, 3 Drawing Sheets

INTEGRATION OF SILICON BORON NITRIDE IN HIGH VOLTAGE AND SMALL PITCH SEMICONDUCTORS

TECHNICAL FIELD

Embodiments disclosed herein are generally directed to the field of semiconductor fabrication and, more particularly, to dielectric materials for high voltage and small pitch semiconductors.

BACKGROUND

Generally, semiconductor devices utilize dielectric materials such as silicon nitride to electrically insulate various elements.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
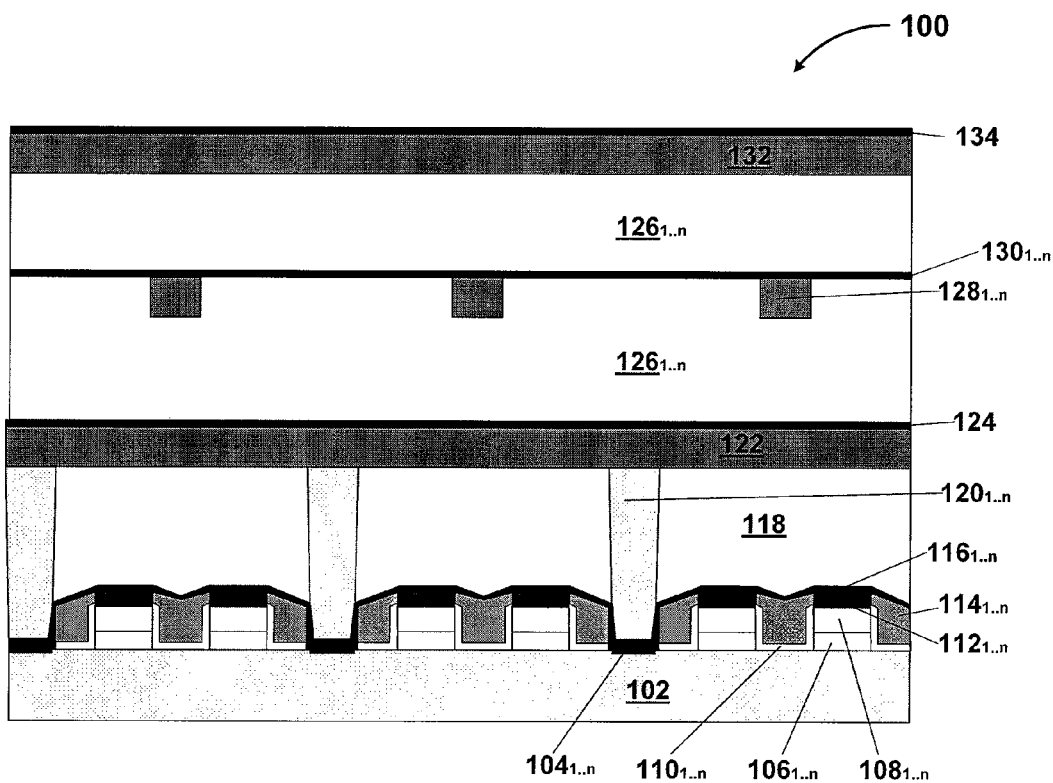
FIG. 1 is a cross-section schematic of an example semiconductor device integrating silicon boron nitride (SiBN), according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of integrating silicon boron nitride (SiBN) in high voltage applications are described herein. In the following description, numerous specific details are set forth to provide so a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a cross-section schematic of an example semiconductor device integrating silicon boron nitride (SiBN) 100. In an embodiment, an apparatus 100 includes a semiconductor substrate 102, contact elements $104_{1 \ldots n}$, floating gates $106_{1 \ldots n}$, control gates $108_{1 \ldots n}$, spacer oxide $110_{1 \ldots n}$, gate metal $112_{1 \ldots n}$, gate spacer dielectric $114_{1 \ldots n}$, gate patterning or contact etch stop dielectric comprising SiBN $116_{1 \ldots n}$, a first interlayer dielectric (ILD) 118, electrically conductive plugs $120_{1 \ldots n}$, first metal layer 122, first via etch stop dielectric 124, a second or more interlayer dielectrics $126_{1 \ldots n}$, a second or more metal interconnect layers $128_{1 \ldots n}$, a second or more via etch stop dielectrics $130_{1 \ldots n}$, final metal interconnect layer 132, and passivation layer 134, where n may represent any suitable integer greater than or equal to 1 to represent one or more structures, each coupled as shown. For the sake of clarity, elements of FIG. 1 have only been labeled once although the structures may repeat as depicted.

Generally, semiconductor devices utilize dielectric materials such as silicon nitride to electrically insulate various elements. As the devices continue to scale, the electric field across dielectric films may increase along with parasitic capacitance induced by the dielectric film itself resulting in an adverse voltage shift. The shift may erode a significant portion of a read window budget in flash cell applications, for example. The effect may be particularly problematic in small pitch and high voltage applications where the electric field may be as high as about 8 MV/cm. In one example, a gate patterning etch stop silicon nitride film may experience catastrophic failures in cycling performance when subjected to a high electric field that produces an electrostatic discharge across the etch stop film. Moreover, current dielectric materials such as silicon nitride may have a concentration of hydrogen, which may further exacerbate problems with erase saturation reliability.

In small pitch and high voltage device applications, dielectric properties such as breakdown voltage and leakage current are critical to deliver greater than 100,000 cycle performance at an electric field as high as about 8 MV/cm. An electric field may refer to at least the field created in the region between a contact $120_{1 \ldots n}$ and a control gate $108_{1 \ldots n}$, including the area across etch stop dielectric $116_{1 \ldots n}$. In a flash memory embodiment, a voltage between a contact and control gate may be up to about 15 V, resulting in a field of about 4 MV/cm. SiBN may have more favorable dielectric properties than silicon nitride (SiN), which is currently used as a dielectric in high voltage applications. In an embodiment, SiBN provides about 25% lower dielectric constant (k). In an embodiment, a dielectric constant for SiBN is adjusted primarily by changing the boron concentration. Increasing the boron concentration may result in a lower k. In an embodiment, k for SiBN is less than about 6. In another embodiment, k for SiBN ranges between about 5 and 6.

In an embodiment, SiBN has an atomic concentration of hydrogen that is considerably lower than SiN. Reduced hydrogen may improve erase saturation performance. In one example embodiment, SiBN has an atomic concentration of hydrogen on the order of about 5-10% while SiN has an atomic concentration of hydrogen on the order of about 10-20%. SiBN may provide lower hydrogen concentration with primary bonding between N—H, which provides superior dielectric properties compared to Si—H bonds, which can easily break down and result in charge traps.

In an embodiment, a microelectronic apparatus 100 includes a semiconductor substrate 102 upon which transistors of an integrated circuit are formed, a plurality of transistor gates $106_{1 \ldots n}$, $108_{1 \ldots n}$, $112_{1 \ldots n}$ formed upon the semiconductor substrate 102, a gate spacer dielectric $114_{1 \ldots n}$ disposed between the gates, and a contact etch stop dielectric $116_{1 \ldots n}$ disposed upon the gates and gate spacer dielectric, each coupled as shown. In an embodiment, the contact etch stop dielectric $116_{1...n}$ includes SiBN to reduce breakdown of the contact etch stop dielectric $116_{1...n}$ in high voltage applications. In an embodiment, contact etch stop dielectric $116_{1...n}$ is in contact with an electrically conductive plug $120_{1...n}$. In another embodiment, contact etch stop dielectric $116_{1...n}$ is a nitride etch stop film (NESL) or unlanded contact (ULC) film. In an embodiment, logic low k etch stop films such as SiCN and SiC are not suitable for high voltage applications due to their low breakdown voltage.

According to an embodiment, SiBN provides lower hydrogen concentration and lower dielectric constant than SiN to increase flash cell erase saturation reliability. Although a NOR flash architecture is depicted in FIG. 1, other semiconductor device applications may also accord with embodiments described herein. In another embodiment, high voltage applications include flash memory such as NOR flash or NAND flash, or other memory such as dynamic random access memory (DRAM), phase change memory (PCM), magnetoresistive RAM (MRAM), or ferroelectric RAM (FRAM), for example. In another embodiment, high voltage applications include high power devices such as metal-oxide-semiconductor field-effect transistor (MOSFET), bipolar, bipolar complementary metal-oxide-semiconductor (BiCMOS), u-shaped MOSFET (UMOSFET), diffusion MOSFET (DMOSFET), lateral diffusion MOSFET (LDMOSFET), junction gate field effect transistor (JFET), bipolar junction transistor (BJT), or insulated gate bipolar transistor (IGBT), for example. In another embodiment, high voltage applications include logic, thin film transistor liquid crystal display (TFT-LCD), solar cell, photonics, or any other device that requires low k and high breakdown dielectric properties. In an embodiment, high voltage applications include semiconductor devices having electric fields greater than about 4 MV/cm.

According to an embodiment, SiBN is formed or deposited from gas precursors such as $Si_2H_2Cl_2$, $NH_3$, $BCl_3$, $SiH_4$, bis(tertiary-butylamino) silane, hexachlorodisilane, disilane, trisilane, or tetrachlorosilane, or suitable combinations thereof. In an embodiment, a thermal furnace is used as a deposition platform with $Si_2H_2Cl_2$, $NH_3$, $BCl_3$ as precursor gases. In an embodiment, SiBN is deposited using plasma enhanced chemical vapor deposition (PECVD), low pressure CVD (LPCVD), atomic layer deposition (ALD), jet vapor deposition (JVD), photo CVD, pulse laser deposition, reactive co-sputtering, boron plasma treatment of SiN, B ion implantation of SiN, or suitable combinations thereof. SiBN film properties may be controlled through process parameter adjustments such as deposition temperature and gas flow ratio, among other parameters.

A semiconductor substrate 102 may include silicon, germanium, silicon germanium, silicon on insulator (SOI), compounds formed using a group III element and group V element, GaAs, GaN, InP, glass, organics, polymer, or suitable combinations thereof. In an embodiment, gates $106_{1...n}$, $108_{1...n}$ include polysilicon. In an embodiment, a tunnel oxide is disposed between floating gates $106_{1...n}$ and semiconductor substrate 102 and inter-poly dielectric is disposed between floating gates $106_{1...n}$ and control gates $108_{1...n}$. Inter-poly dielectric may require a higher dielectric constant to generate high voltage coupling ratio to drive from control gates $108_{1...n}$ to floating gates $106_{1...n}$. In an embodiment, contact elements $104_{1...n}$ and gate metal $112_{1...n}$ include salicide. In an embodiment, salicide includes Ti, Co, Ni, Pt, or W, or suitable combinations thereof. In an embodiment, gate spacer dielectric $114_{1...n}$ includes SiBN to reduce gate interference such as floating gate-floating gate $106_{1...n}$ coupling, for example, or to reduce breakdown of the gate spacer dielectric $114_{1...n}$ in high voltage applications.

In an embodiment, a microelectronic apparatus 100 further includes a first interlayer dielectric 118 disposed upon the contact etch stop dielectric $116_{1...n}$, a first metal layer 122 disposed upon the first interlayer dielectric 118, one or more electrically conductive plugs $120_{1...n}$, to electrically couple the first metal layer 122 with the one or more transistor gates $106_{1...n}$, $108_{1...n}$, and a via etch stop dielectric 124 disposed upon the first metal layer 122. In an embodiment, the via etch stop dielectric 124 includes SiBN to provide a low k electrical insulator.

A first interlayer dielectric (ILD) 118 may include $SiO_2$ or any other suitable dielectric material, in an embodiment. First ILD 118 may be referred to as ILD0, in an embodiment. A first metal layer 122 may include Cu, Al, or any other suitable metal. One or more electrically conductive plugs $120_{1...n}$, may include W or any other suitable electrically conductive material.

A second or more interlayer dielectrics $126_{1...n}$ may be disposed upon the first via etch stop dielectric 124, according to an embodiment. In an embodiment, a second or more metal interconnect layers $128_{1...n}$ are successively stacked in an alternating manner with the second or more interlayer dielectrics $126_{1...n}$ such that the metal interconnect layers $128_{1...n}$ are separated from one another by the interlayer dielectrics $126_{1...n}$. In an embodiment, interlayer dielectrics $126_{1...n}$ and metal interconnect layers $128_{1...n}$ include patterned layers that are coupled to deliver power and/or electrical signals to transistors of an integrated circuit. Such patterning may include forming vias and trenches using well-known lithography, etch, chemical mechanical polishing/planarization (CMP) and/or thin film deposition methods. In an embodiment, forming a backend metal stack 122, $128_{1...n}$, 132 includes using a dual damascene process. According to an embodiment, about ten metal layers $128_{1...n}$ are used to provide a network of metal interconnects.

Each metal interconnect layer $128_{1...n}$ may have a via etch stop dielectric $130_{1...n}$ disposed upon the metal layer $128_{1...n}$. According to an embodiment, one or more via etch stop dielectrics $130_{1...n}$ include SiBN to provide low k electrical insulation and/or a material with good etch selectivity. Metal interconnect layers $128_{1...n}$ may include Cu, Al, or any other suitable metal. In another embodiment, second or more interlayer dielectrics (ILD) $126_{1...n}$ include SiOF, fluorinated silica glass (FSG), or any other suitable dielectric.

In an embodiment, a final metal interconnect layer 132 is disposed upon the alternating layers of the second or more interlayer dielectrics $126_{1...n}$ and the second or more metal interconnect layers $128_{1...n}$ and a passivation layer 134 is disposed upon the final metal interconnect layer 132. In one embodiment, the passivation layer includes SiBN. In another embodiment, the final metal interconnect layer 132 includes Cu, Al, or any other suitable metal.

Figure 2:
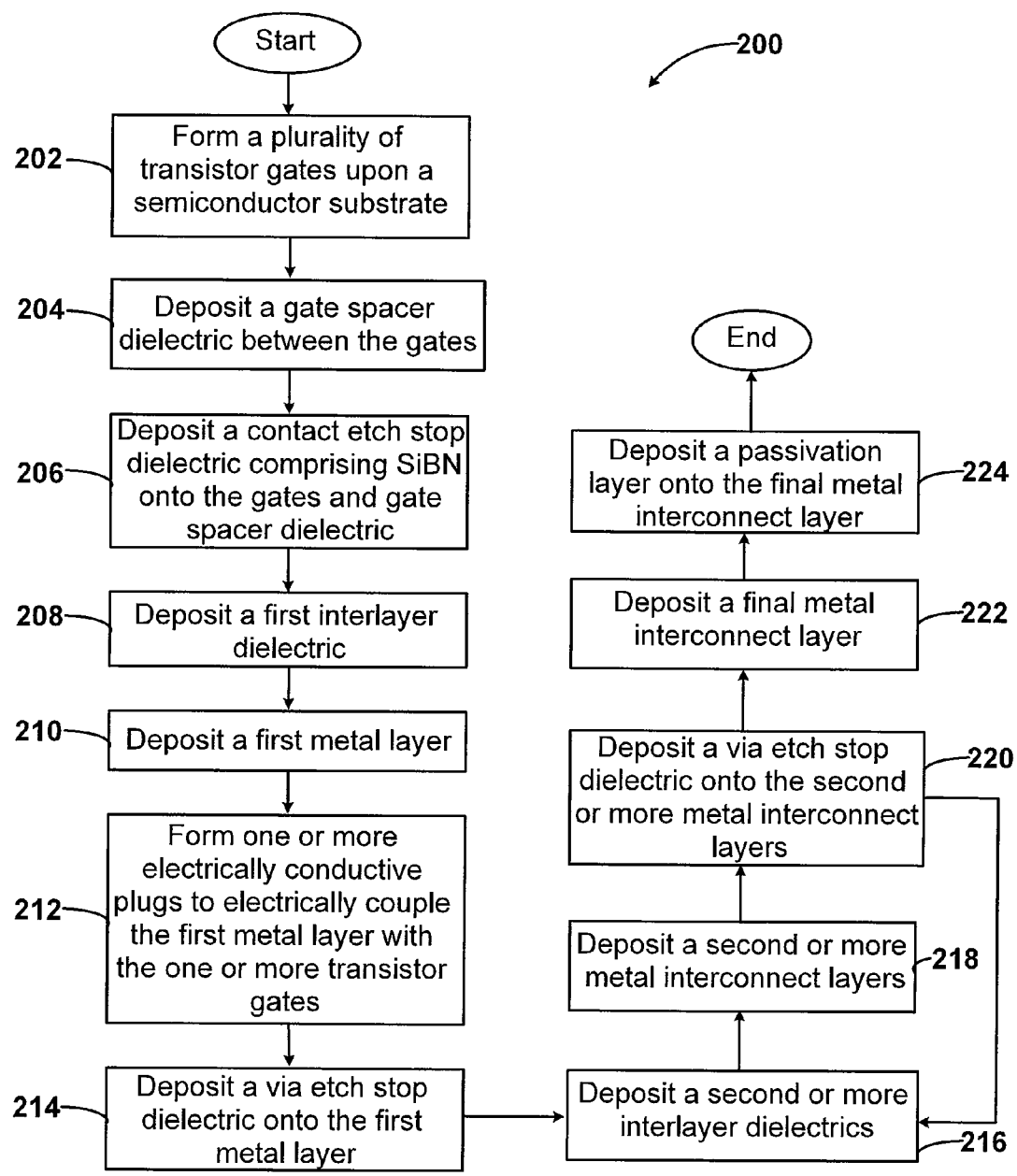
FIG. 2 is a flow diagram of a method for integrating SiBN in a semiconductor device, according to but one embodiment.

FIG. 2 is a flow diagram of a method for integrating SiBN in a semiconductor device 200, according to but one embodiment. In an embodiment, a method 200 includes forming a plurality of transistor gates upon a semiconductor substrate 202, depositing a gate spacer dielectric between the gates 204, depositing a contact etch stop dielectric including SiBN onto the gates and gate spacer dielectric 206, depositing a first interlayer dielectric 208, depositing a first metal layer 210, forming one or more electrically conductive plugs to electrically couple the first metal layer with the one or more transistor gates 212, depositing a via etch stop dielectric onto the first metal layer 214, depositing a second or more interlayer dielectrics 216, depositing a second or more metal interconnect layers 218, depositing a via etch stop dielectric onto the second or more metal interconnect layers 220, depositing a final metal interconnect layer 222, and depositing a passivation layer onto the final metal interconnect layer 224, with arrows providing a suggested flow.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

In an embodiment, a method 200 includes forming a plurality of transistor gates upon a semiconductor substrate 202, depositing a gate spacer dielectric between the gates 204, and depositing a contact etch stop dielectric onto the gates and gate spacer dielectric 206, the contact etch stop dielectric including silicon boron nitride (SiBN) to reduce breakdown of the contact etch stop dielectric in high voltage applications. In another embodiment, a gate spacer dielectric includes SiBN.

A method 200 may further include depositing a first interlayer dielectric onto the etch stop dielectric 208, depositing a first metal layer onto the first interlayer dielectric 210, forming one or more electrically conductive plugs to electrically couple the first metal layer with the one or more transistor gates 212, depositing a via etch stop dielectric onto the first metal layer 214, depositing a second or more interlayer dielectrics onto the via etch stop dielectric wherein the via etch stop dielectric includes SiBN to provide a low k electrical insulator 216, depositing a second or more metal interconnect layers 218 in an alternating manner with the second or more interlayer dielectrics such that the metal interconnect layers are separated from one another by the interlayer dielectrics, each metal interconnect layer having a via etch stop dielectric disposed 220 upon the metal layer wherein each via etch stop dielectric comprises SiBN to provide a low k electrical insulator, depositing a final metal interconnect layer onto the alternating layers of the second or more interlayer dielectrics and the second or more metal interconnect layers 222, and depositing a passivation layer onto the final metal interconnect layer wherein the passivation layer comprises SiBN 224.

In an embodiment, multiple interconnect layers are formed by repeating actions 216, 218, and 220. Well known patterning steps such as lithography patterning, etch processes, and/or chemical mechanical planarization/polishing (CMP) may be omitted from method 200 for the sake of clarity, but fall within the scope of this specification. SiBN may be deposited and/or formed according to embodiments already described with respect to FIG. 2. Other similar elements of method 200 may also accord with embodiments already described.

Figure 3:
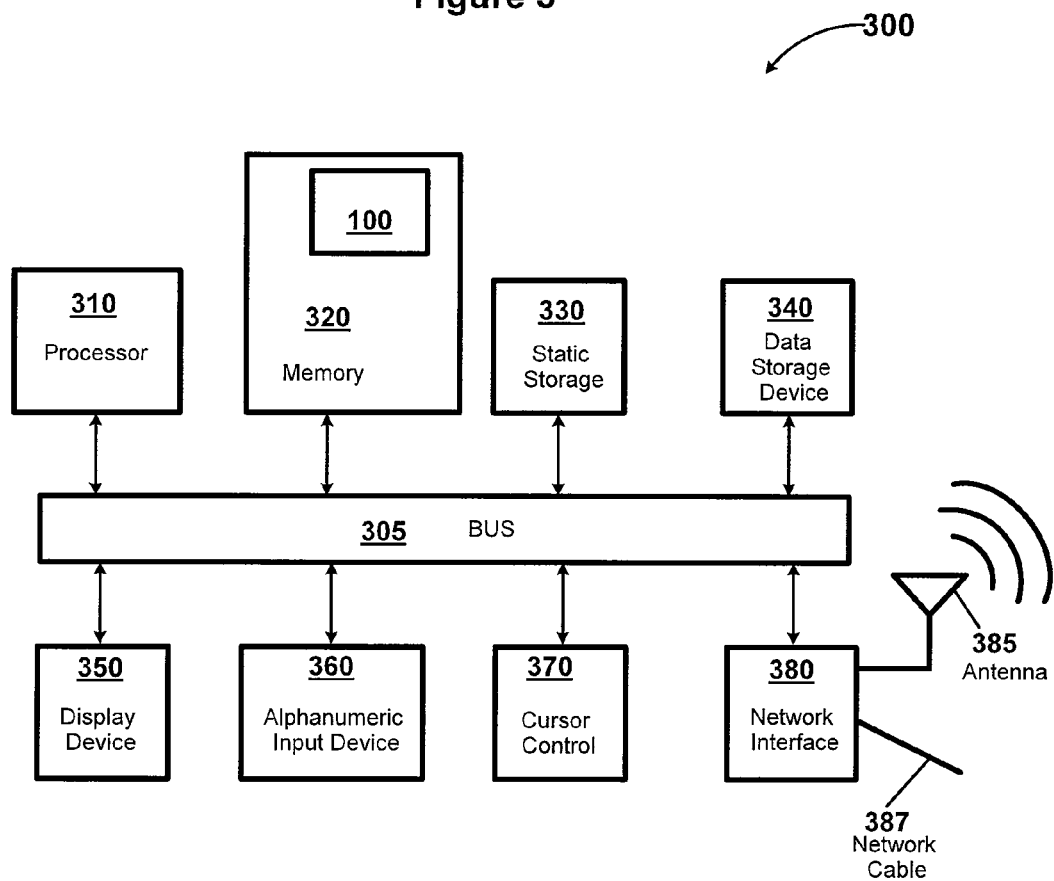
FIG. 3 is a diagram of an example system in which embodiments of the present invention may be used, according to but one embodiment.

FIG. 3 is a diagram of an example system in which embodiments of the present invention may be used, according to but one embodiment. System 300 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 300 includes a semiconductor device integrating silicon boron nitride (SiBN) 100 in accordance with embodiments described with respect to FIGS. 1-2. In an embodiment, a semiconductor device integrating SiBN 100 is part of an electronic system's memory 320 or processor 310.

Electronic system 300 may include bus 305 or other communication device to communicate information, and processor 310 coupled to bus 305 that may process information. While electronic system 300 may be illustrated with a single processor, system 300 may include multiple processors and/or co-processors. In an embodiment, processor 310 includes a semiconductor device integrating silicon boron nitride (SiBN) 100 in accordance with embodiments described herein. System 300 may also include random access memory (RAM) or other storage device 320 (may be referred to as memory), coupled to bus 305 and may store information and instructions that may be executed by processor 310.

Memory 320 may also be used to store temporary variables or other intermediate information during execution of instructions by processor 310. Memory 320 is a flash memory device in one embodiment. In another embodiment, memory 320 includes a semiconductor device integrating silicon boron nitride (SiBN) 100 as disclosed herein.

System 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled with electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate information and command selections to processor 310 and to control cursor movement on display 350.

Electronic system 300 further may include one or more network interfaces 380 to provide access to network, such as a local area network. Network interface 380 may include, for example, a wireless network interface having antenna 385, which may represent one or more antennae. Network interface 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface 380 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 300 includes one or more omnidirectional antennae 385, which may refer to an antenna that is at least partially omnidirectional and/or substantially omnidirectional, and a processor 310 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. A microelectronic apparatus, comprising:
    a semiconductor substrate;
    a plurality of transistor gates formed upon the semiconductor substrate;
    a gate spacer dielectric disposed between the gates, the gate spacer dielectric comprising SiBN to reduce gate interference; and
    a contact etch stop dielectric disposed upon the gates and gate spacer dielectric, the contact etch stop dielectric comprising silicon boron nitride (SiBN) to reduce breakdown of the contact etch stop dielectric in high voltage applications.

2. An apparatus according to claim 1 further comprising:
    a first interlayer dielectric disposed upon the contact etch stop dielectric;
    a first metal layer disposed upon the first interlayer dielectric;
    one or more electrically conductive plugs to electrically couple the first metal layer with the one or more transistor gates; and
    a via etch stop dielectric disposed upon the first metal layer.

3. An apparatus according to claim 2 further comprising:
    a second or more interlayer dielectrics disposed upon the via etch stop dielectric wherein the via etch stop dieletric comprises SiBN to provide a low k electrical insulator;
    a second or more metal interconnect layers successively stacked in an alternating manner with the second or more interlayer dielectrics such that the metal interconnect layers are separated from one another by the interlayer dielectrics, each metal interconnect layer having a via etch stop dielectric disposed upon the metal layer wherein each via etch stop dielectric comprises SiBN to provide a low k electrical insulator;
    a final metal interconnect layer disposed upon the alternating layers of the second or more interlayer dielectrics and the second or more metal interconnect layers; and
    a passivation layer disposed upon the final metal interconnect layer wherein the passivation layer comprises SiBN.

4. An apparatus according to claim 1 wherein the SiBN provides lower hydrogen concentration and lower dielectric constant than SiN to increase flash cell erase saturation reliability.

5. An apparatus according to claim 1 wherein the semiconductor substrate comprises silicon, germanium, silicon germanium, silicon on insulator (SOI), compounds formed using a group III element and group V element, GaAs, GaN, InP, glass, organics, polymer, or suitable combinations thereof.

6. An apparatus according to claim 1 wherein the contact etch stop dielectric comprises silicon boron nitride (SiBN) to reduce breakdown of the contact etch stop dielectric in high voltage applications, the high voltage applications comprising electric fields greater than about 4 MV/cm in memory, metal-oxide-semiconductor field-effect transistor (MOSFET), bipolar complementary metal-oxide-semiconductor (BiCMOS), logic, thin film transistor liquid crystal display (TFT-LCD), solar cell, photonics, or high power devices, or suitable combinations thereof.

7. An apparatus according to claim 1 wherein the SiBN is formed from gas precursors comprising $Si_2H_2Cl_2$, $NH_3$, $BCl_3$, $SiH_4$, bis(tertiary-butylamino) silane, hexachlorodisilane, disilane, trisilane, or tetrachlorosilane, or suitable combinations thereof.

8. An apparatus according to claim 1 wherein the SiBN is deposited using plasma enhanced chemical vapor deposition (PECVD), low pressure CVD (LPCVD), atomic layer deposition (ALD), jet vapor deposition (JVD), photo CVD, pulse laser deposition, reactive co-sputtering, boron plasma treatment of SiN, B ion implantation of SiN, or suitable combinations thereof.

9. A methods comprising:
    forming a plurality of transistor gates upon a semiconductor substrate;
    depositing a gate spacer dielectric between the gates, the gate spacer dielectric comprising SiBN;
    depositing a contact etch stop dielectric onto the gates and gate spacer dielectric, the contact etch stop dielectric comprising silicon boron nitride (SiBN) to reduce breakdown of the contact etch stop dielectric in high voltage applications;
    depositing a first interlayer dielectric onto the contact etch stop dielectric;
    depositing a first metal layer onto the first interlayer dielectric;
    forming one or more electrically conductive plugs to electrically couple the first metal layer with the one or more transistor gates; and
    depositing a via etch stop dielectric onto the first metal layer.

10. A method according to claim 9, further comprising:
    depositing a second or more interlayer dielectrics onto the via etch stop dielectric wherein the via etch stop dielectric comprises SiBN to provide a low k electrical insulator;
    depositing a second or more metal interconnect layers in an alternating manner with the second or more interlayer dielectrics such that the metal interconnect layers are separated from one another by the interlayer dielectrics, each metal interconnect layer having a via etch stop dielectric disposed upon the metal layer wherein each via etch stop dielectric comprises SiBN to provide a low k electrical insulator;

depositing a final metal interconnect layer onto the alternating layers of the second or more interlayer dielectrics and the second or more metal interconnect layers; and depositing a passivation layer onto the final metal interconnect layer wherein the passivation layer comprises SiBN.

11. A method according to claim 9 wherein the SiBN provides lower hydrogen concentration and lower dielectric constant than SiN to increase flash cell erase saturation reliability or wherein the SiBN reduces breakdown of the contact etch stop dielectric in high voltage applications comprising electric fields greater than about 4 MV/cm in memory, metal-oxide-semiconductor field-effect transistor (MOSFET), bipolar complementary metal-oxide-semiconductor (BiCMOS), logic, thin film transistor liquid crystal display (TFT-LCD), solar cell, photonics, or high power devices, or suitable combinations thereof.

12. A method according to claim 9 wherein the SiBN is formed from gas precursors comprising $Si_2H_2Cl_2$, $NH_3$, $BCl_3$, $SiH_4$, bis(tertiary-butylamino) silane, hexachlorodisilane, disilane, trisilane, or tetrachlorosilane, or suitable combinations thereof.

13. A method according to claim 9, wherein the SiBN is deposited using plasma enhanced chemical vapor deposition (PECVD), low pressure CVD (LPCVD), atomic layer deposition (ALD), jet vapor deposition (JVD), photo CVD, pulse laser deposition, reactive co-sputtering, boron plasma treatment of SiN, B ion implantation of SiN, or suitable combinations thereof.

14. A microelectronic apparatus, comprising:
a semiconductor substrate;
a plurality of transistor gates formed upon the semiconductor substrate;
a gate spacer dielectric disposed between the gates;
a contact etch stop dielectric disposed upon the gates and gate spacer dielectric, the contact etch stop dielectric comprising silicon boron nitride (SiBN) to reduce breakdown of the contact etch stop dielectric in high voltage applications;
a first interlayer dielectric disposed upon the contact etch stop dielectric;
a first metal layer disposed upon the first interlayer dielectric;
one or more electrically conductive plugs to electrically couple the first metal layer with the one or more transistor gates; and
a via etch stop dielectric disposed upon the first metal layer.

15. An apparatus according to claim 14, further comprising:
a second or more interlayer dielectrics disposed upon the via etch stop dielectric wherein the via etch stop dieletric comprises SiBN to provide a low k electrical insulator;
a second or more metal interconnect layers successively stacked in an alternating manner with the second or more interlayer dielectrics such that the metal interconnect layers are separated from one another by the interlayer dielectrics, each metal interconnect layer having a via etch stop dielectric disposed upon the metal layer wherein each via etch stop dielectric comprises SiBN to provide a low k electrical insulator;
a final metal interconnect layer disposed upon the alternating layers of the second or more interlayer dielectrics and the second or more metal interconnect layers; and
a passivation layer disposed upon the final metal interconnect layer wherein the passivation layer comprises SiBN.

16. An apparatus according to claim 14, wherein the SiBN provides lower hydrogen concentration and lower dielectric constant than SiN to increase flash cell erase saturation reliability.

17. An apparatus according to claim 14, wherein the semiconductor substrate comprises silicon, germanium, silicon germanium, silicon on insulator (SOI), compounds formed using a group III element and group V element, GaAs, GaN, InP, glass, organics, polymer, or suitable combinations thereof.

18. An apparatus according to claim 14, wherein the contact etch stop dielectric comprises silicon boron nitride (SiBN) to reduce breakdown of the contact etch stop dielectric in high voltage applications, the high voltage applications comprising electric fields greater than about 4 MV/cm in memory, metal-oxide-semiconductor field-effect transistor (MOSFET), bipolar complementary metal-oxide-semiconductor (BiCMOS), logic, thin film transistor liquid crystal display (TFT-LCD), solar cell, photonics, or high power devices, or suitable combinations thereof.

19. An apparatus according to claim 14, wherein the SiBN is formed from gas precursors comprising $Si_2H_2Cl_2$, $NH_3$, $BCl_3$, $SiH_4$, bis(tertiary-butylamino) silane, hexachlorodisilane, disilane, trisilane, or tetrachlorosilane, or suitable combinations thereof.

20. An apparatus according to claim 14, wherein the SiBN is deposited using plasma enhanced chemical vapor deposition (PECVD), low pressure CVD (LPCVD), atomic layer deposition (ALD), jet vapor deposition (JVD), photo CVD, pulse laser deposition, reactive co-sputtering, boron plasma treatment of SiN, B ion implantation of SiN, or suitable combinations thereof.

* * * * *

UNITED STATES PATENT AND TRADEMARK OFFICE
CERTIFICATE OF CORRECTION

PATENT NO. : 7,633,125 B2 Page 1 of 1
APPLICATION NO. : 11/848422
DATED : December 15, 2009
INVENTOR(S) : Donghui Lu et al.

It is certified that error appears in the above-identified patent and that said Letters Patent is hereby corrected as shown below:

In column 7, line 60, in Claim 3, delete "dieletric" and insert -- dielectric --, therefor.

In column 8, line 40, in Claim 9, delete "methods" and insert -- method, --, therefor.

In column 10, line 4, in Claim 15, delete "dieletric" and insert -- dielectric --, therefor.

Signed and Sealed this

Sixteenth Day of March, 2010

David J. Kappos
*Director of the United States Patent and Trademark Office*